(12) United States Patent
Wang et al.

(10) Patent No.: US 10,877,086 B2
(45) Date of Patent: Dec. 29, 2020

(54) HOLDER

(71) Applicant: NANYA TECHNOLOGY CORPORATION, New Taipei (TW)

(72) Inventors: Ching-Chung Wang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 84 days.

(21) Appl. No.: 16/211,208

(22) Filed: Dec. 5, 2018

(65) Prior Publication Data

US 2020/0182926 A1  Jun. 11, 2020

(51) Int. Cl.
*G01R 31/28* (2006.01)
*H05K 1/18* (2006.01)
*G01R 1/04* (2006.01)
*H05K 1/02* (2006.01)

(52) U.S. Cl.
CPC ....... *G01R 31/2808* (2013.01); *G01R 1/0416* (2013.01); *H05K 1/0268* (2013.01); *H05K 1/181* (2013.01)

(58) Field of Classification Search
CPC .... G01R 31/2808; G01R 1/0416; G01R 1/04; H05K 1/181; H05K 1/0268; G01L 1/2206

USPC ...... 324/756.01–758.01, 750.01–750.3, 500, 324/600, 754.07–754.08, 762.01

See application file for complete search history.

(56) References Cited

U.S. PATENT DOCUMENTS

2006/0177349 A1* 8/2006 Thaysen .............. G01N 29/036
                                                          422/82.02
2013/0183862 A1* 7/2013 Ni ........................ H05K 3/4046
                                                          439/620.22

* cited by examiner

*Primary Examiner* — Melissa J Koval
*Assistant Examiner* — Trung Nguyen
(74) *Attorney, Agent, or Firm* — CKC & Partners Co., LLC

(57) ABSTRACT

A holder includes a substrate, at least one first fastener and a pressure block. The substrate includes a top surface, a primary recess recessed from the top surface, at least one first side-recess recessed from the top surface, wherein the first side-recess neighbors and communicates with the primary recess, and a channel recess recessed from the top surface, wherein the channel recess neighbors and communicates with the primary recess, and the first side-recess and the channel recess are positioned at opposite sides of the primary recess. The first fastener is disposed in the first side-recess, wherein the first fastener has a top substantially leveled with the top surface of the substrate. The pressure block is disposed in the channel recess, wherein the pressure block has a top substantially leveled with the top surface of the substrate.

13 Claims, 8 Drawing Sheets

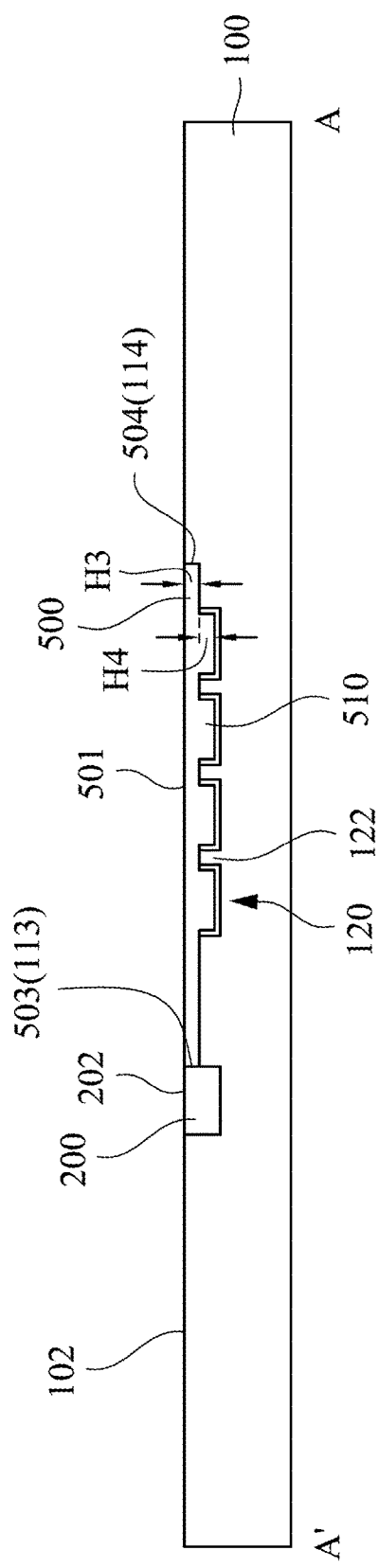
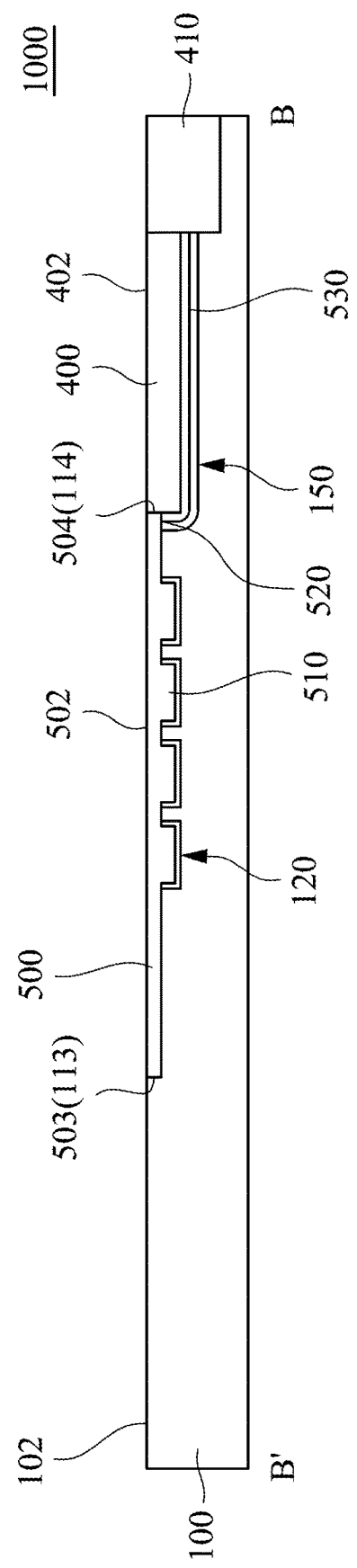
Fig. 6A
Fig. 6B

HOLDER

BACKGROUND

Description of Related Art

Circuit boards such as printed circuit boards (PCBs) are important components in a variety of electronic products. The main function of the printed circuit board is to provide an electric connection between the components in the electronic device. In general, it is necessary to test the printed circuit board to ensure its electrical properties and the performance. When testing the PCB, the PCB is placed on a holder of a testing device. The testing device has a probe to contact the testing points of the PCB to inspect the PCB. In conventional testing device, since the holder firmly fastens the PCB thereon, the position of the PCB is difficult to be adjusted. For example, it is unable to change the direction of the PCB. Moreover, the center of the PCB cannot be supported by the holder of the conventional testing device. When the probe contacts the testing points near the center of the PCB, the PCB may be pressed down. Once the probe disconnects the PCB, the PCB may bounce back and hit the probe, resulting in the damage of the probe. Accordingly, there is a demand for a novel holder to solve the above problems.

SUMMARY

The present invention provides a holder for testing a printed circuit board which may improve the stability and the testing efficiency.

In accordance with an aspect of the present disclosure, a holder is provided. The holder includes a substrate, at least one first fastener and a pressure block. The substrate includes a top surface, a primary recess recessed from the top surface, at least one first side-recess recessed from the top surface, wherein the first side-recess neighbors and communicates with the primary recess, and a channel recess recessed from the top surface, wherein the channel recess neighbors and communicates with the primary recess, and the first side-recess and the channel recess are positioned at opposite sides of the primary recess. The first fastener is disposed in the first side-recess, wherein the first fastener has a top substantially leveled with the top surface of the substrate. The pressure block is disposed in the channel recess, wherein the pressure block has a top substantially leveled with the top surface of the substrate.

According to one embodiment of the present invention, the pressure block has a top substantially leveled with the top surface of the substrate.

According to one embodiment of the present invention, the substrate further includes at least one cavity which is recessed from a bottom of the primary recess.

According to one embodiment of the present invention, the primary recess has a depth of about 0.5 mm to 3 mm from the bottom of the primary recess.

According to one embodiment of the present invention, the primary recess has a polygon contour in a plan view.

According to one embodiment of the present invention, the primary recess has a first sidewall, a second sidewall opposite thereto, and third sidewall connected the first sidewall and the second sidewall, wherein the first side-recess adjoins the first sidewall and the channel recess adjoins the second sidewall.

According to one embodiment of the present invention, the substrate further includes at least one second side-recess recessed from the top surface, and the second side-recess neighboring and communicated with the third sidewall of the primary recess.

According to one embodiment of the present invention, the holder further includes at least one second fastener disposed in the second side-recess, wherein the second fastener has a top substantially leveled with the top surface of the substrate.

According to one embodiment of the present invention, the substrate comprises polytetrafluoroethylene.

According to one embodiment of the present invention, the first fastener, and the pressure block include same material.

According to one embodiment of the present invention, the first fastener further includes a body, and a protruding part projecting from a side of the body, wherein the protruding part adjoins the primary recess.

According to one embodiment of the present invention, the protruding part of the first fastener includes elastic plastic.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 6A-6C are cross-sectional view of the holder in FIG. 5 in accordance with some embodiments of the present disclosure.

DETAILED DESCRIPTION

Figure 1:
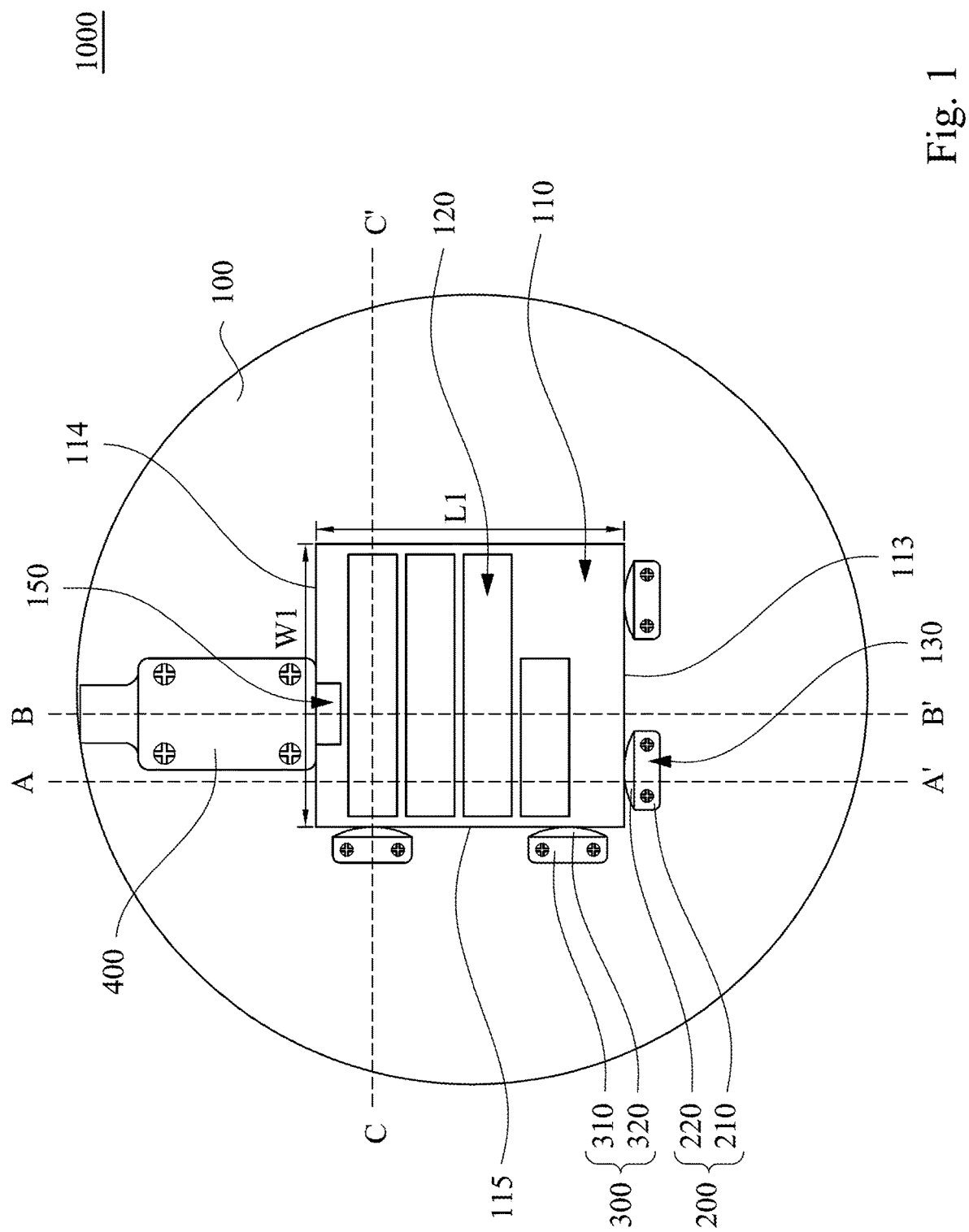
FIG. 1 is a top view illustrating a holder in accordance with various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a top view illustrating a holder 1000 in accordance with various embodiments of the present disclosure. Referring to FIG. 1, the holder 1000 includes a substrate 100, at least one first fastener 200, and a pressure block 400. The holder 1000 may have a circular contour in a plan view, as illustrated in FIG. 1. In some embodiments, the substrate 100 may include polytetrafluoroethylene (PTFE), or the like. Polytetrafluoroethylene (PTFE) is a material with both insulating and thermostable properties, and therefore is a suitable material as a holder for testing the printed circuit board (PCB). The holder 1000 may optionally include other elements, which are described hereinafter.

Figure 2A:
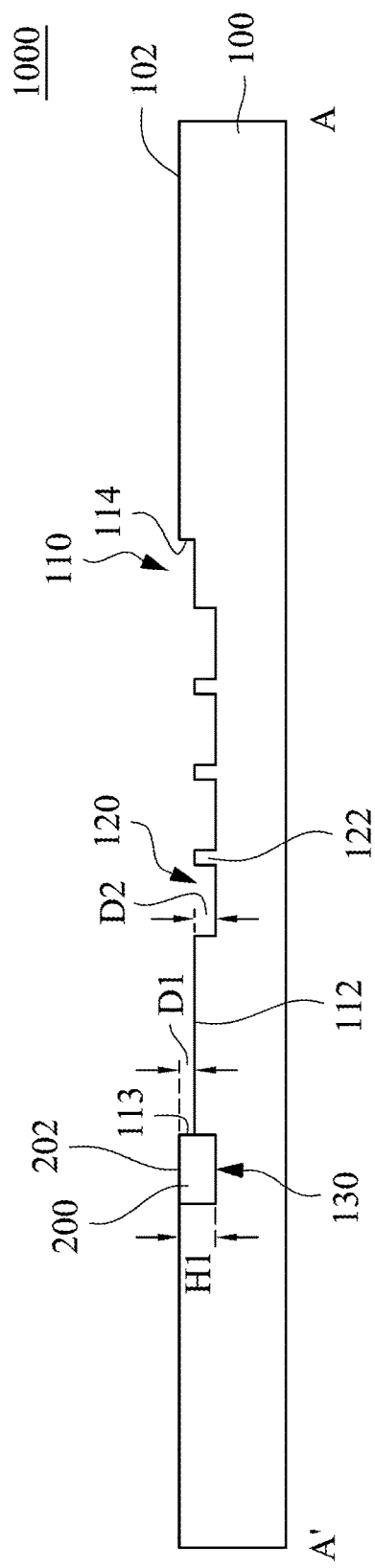
FIGS. 2A-2C are cross-sectional view of the holder in FIG. 1 in accordance with various embodiments of the present disclosure.

FIG. 2A is a cross-sectional view illustrating the holder 1000 along a cross-section A-A' in FIG. 1 in accordance with various embodiments of the present disclosure. Referring to FIG. 1 and FIG. 2A. The substrate 100 includes a primary recess 110 recessed from the top surface 102 of the substrate 100. In various embodiments, the primary recess 110 has a polygon contour in a plan view. For example, the primary recess 110 has a quadrilateral contour, as illustrated in FIG. 1. The primary recess 110 is configured to accommodate a printed circuit board (PCB) to be tested, and the primary recess 110 may have a dimension that is substantially equal to a dimension of the printed circuit board. That is, the primary recess 110 has a length L1, a width W1 (shown in FIG. 1), and a depth D1 (shown in FIG. 2A) that is substantially equal to a length, a width, and a thickness of the printed circuit board to be tested. In some embodiments, the depth D1 of the primary recess 110 may be about 0.5 mm to 3 mm measured from the bottom 112 of the primary recess 110 to the top surface 102 of the substrate 100, as depicted in FIG. 2A. For example, the depth D1 may be 0.6, 0.7, 0.8, 0.9, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, or 2.9 mm. In some embodiments, the substrate 100 may further include at least one cavity 120 which is recessed from the bottom 112 of the primary recess 110. In some embodiments, the substrate 100 includes a plurality of cavities 120, and the adjacent cavities 120 may be separated by a highland portion 122. In some examples, each cavity 120 has a depth D2 recessed from the bottom 112 of the primary recess 110. Each cavity 120 is configured to accommodate at least one chip positioned on the printed circuit board. It is understood that the number, the dimension and the arrangement of the cavity 120 can be changed, depending on the need.

Still referring to FIG. 1 and FIG. 2A. At least one first side-recess 130 is recessed from the top surface 102, and the first side-recess 130 neighbors and communicates with the primary recess 110. In some embodiments, the first side-recess 130 adjoins a first sidewall 113 of the primary recess 110. As shown in FIG. 2A, at least one first fastener 200 is disposed in the first side-recess 130, and the first fastener 200 has a top 202 substantially leveled with the top surface 102 of the substrate 100. The first fastener 200 may have a thickness H1. In some embodiments, the thickness H1 may be greater than the depth D1 of the primary recess 110. It is understood that the number, the dimension, and the arrangement of the first fastener 200 is not limited to FIG. 1, it may depend on the dimension of the primary recess 110 (i.e., the dimension of the printed circuit board to be placed in the primary recess 110). More specifically, if the dimension of the printed circuit board to be placed in the primary recess 110 has a larger dimension, it may need more first fastener 200 or larger first fastener 200 to fasten the printed circuit board steady.

Figure 2B:
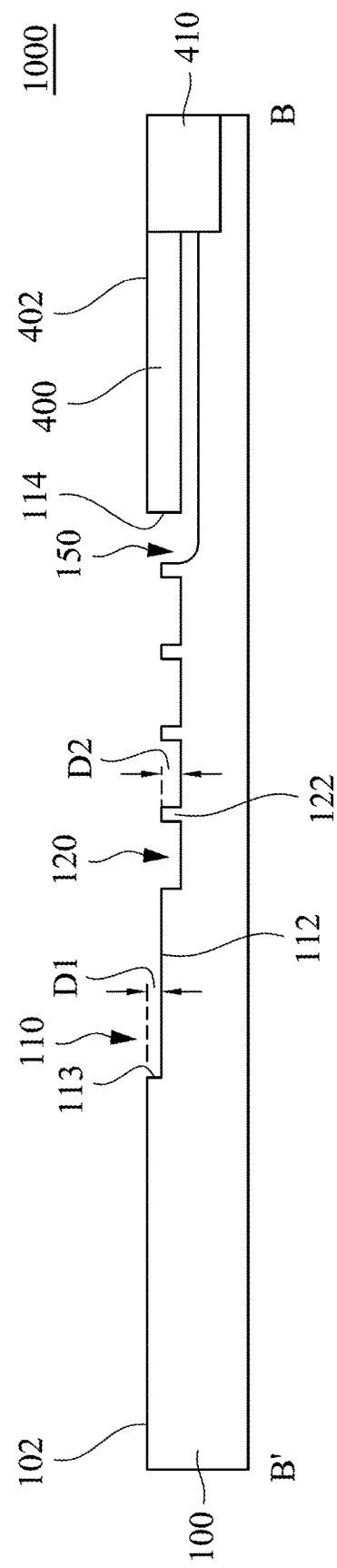

FIG. 2B is a cross-sectional view illustrating the holder 1000 along a cross-section B-B' in accordance with various embodiments of the present disclosure. Referring to FIG. 1 and FIG. 2B. The channel recess 150 recessed from a top surface 102 of the primary recess 110, and the channel recess 150 neighbors and communicates with the primary recess 110. In some embodiments, the channel recess 150 adjoins a second sidewall 114 which is opposite to the first sidewall 113 of the primary recess 110. That is, the channel recess 150 and the first side-recess 130 are positioned at opposite sides of the primary recess 110. In some embodiments, the channel recess 150 may extend from the second sidewall 114 to one end of the substrate 100 so as to reach to the power terminal 410, as shown in FIG. 2B. The channel recess 150 is configured to provide a region to accommodate one or more cables which electrically connect to the power terminal 410.

Still referring to FIG. 1 and FIG. 2B. The pressure block 400 is disposed in the channel recess 150, and has a top 402 substantially leveled with the top surface 102 of the substrate 100. The pressure block 400 may press the cable, such that the cable may be fixed in the channel recess 150. In some embodiments, the pressure block 400 may include the same material as the substrate 100 and the first fastener 200. For example, the substrate 100, the first fastener 200, and the pressure block 400 may include PTFE.

Figure 2C:
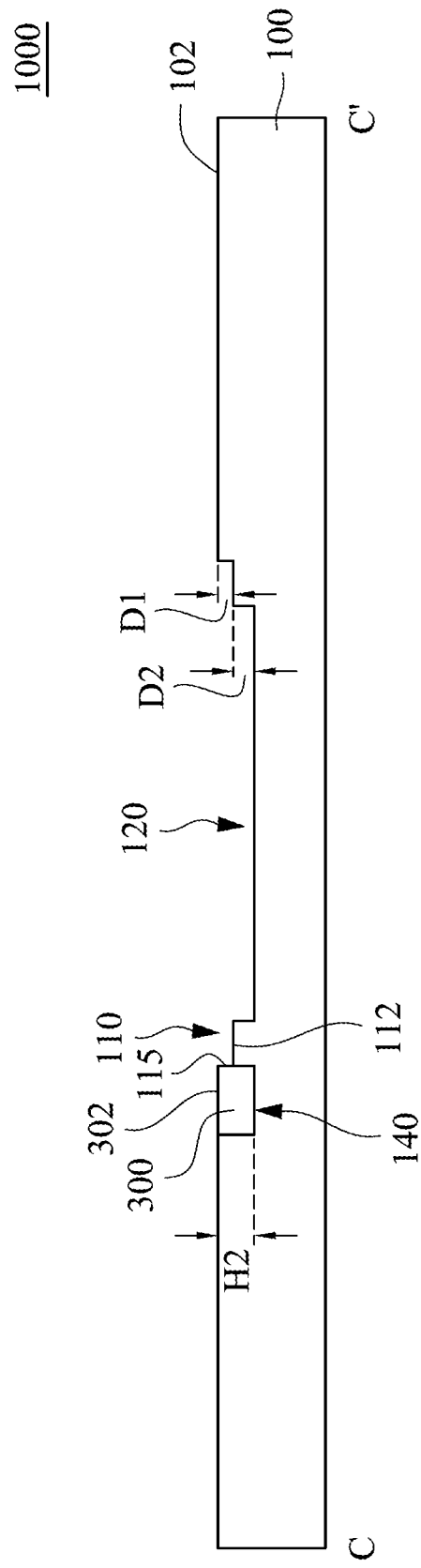

FIG. 2C is a cross-sectional view illustrating the holder 1000 along a cross-section C-C' in accordance with various embodiments of the present disclosure. Referring to FIG. 1 and FIG. 2C. In some embodiments, the substrate 100 may further include at least one second side-recess 140 recessed from the top surface 102, and the second side-recess 140 neighbors and communicates with the primary recess 110. In some embodiments, the second side-recess 140 adjoins a third sidewall 115 which connects the first sidewall 113 and the second sidewall 114 of the primary recess 110. In some embodiments, the holder 1000 may further include at least one second fastener 300 disposed in the second side-recess 140, and the second fastener 300 has a top 302 substantially leveled with the top surface 102 of the substrate 100, as shown in FIG. 2C. The second fastener 300 may have a thickness H2. In some embodiments, the thickness H2 may be greater than the depth D1 of the primary recess 110. It is understood that the number, the dimension, and the arrangement of the second fastener 300 is not limited to FIG. 1, it may depend on the dimension of the primary recess 110 (i.e., the dimension of the printed circuit board to be placed in the primary recess 110). More specifically, if the dimension of the printed circuit board to be placed in the primary recess 110 has a larger dimension, it may need more second fastener 300 or larger second fastener 300 to fasten the printed circuit board steady.

Figure 3B:
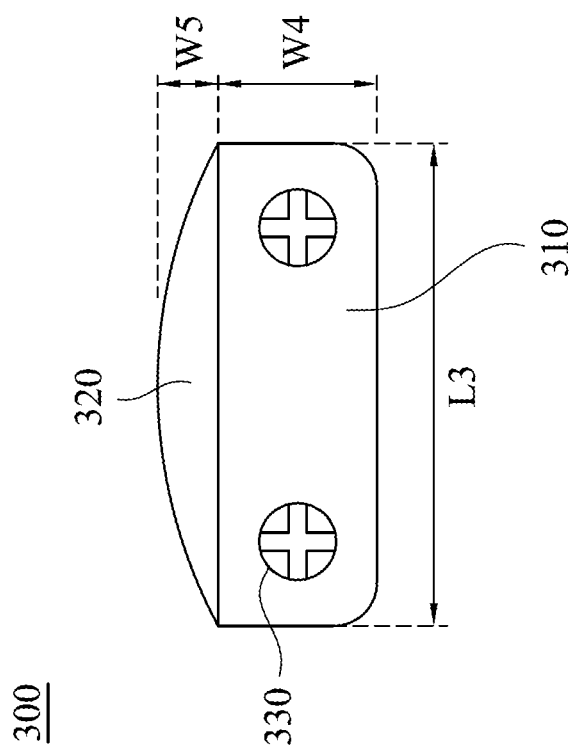
FIGS. 3A-3B are a top view illustrating a fastener of the holder in accordance with various embodiments of the present disclosure.
Figure 3A:
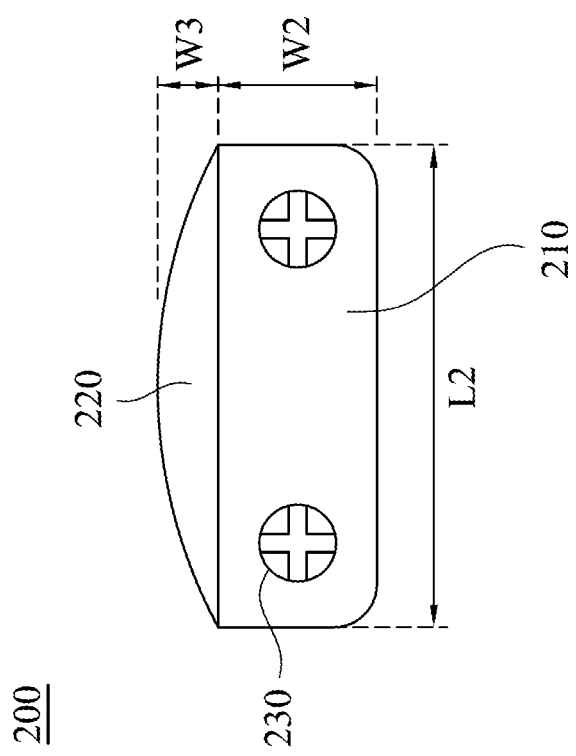

Reference is made to FIG. 3A. FIG. 3A is a top view illustrating the first fastener 200 of the holder 1000 in accordance with various embodiments of the present disclosure. In various embodiments, the first fastener 200 may further include a body 210 and a protruding part 220 projecting from a side of the body 210. In some embodiments, the protruding part 220 adjoins the first sidewall 113 of the primary recess 110, as shown in FIG. 1. As shown in FIG. 3A, the first fastener 200 may further include at least one fixed element 230, such as a screw, in the body 210 to fix the first fastener 200 to the first side-recess 130. In some embodiments, the protruding part 220 of the first fastener 200 may include elastic plastic. In some examples, the body 210 may include the same material as the protruding part 220. More specifically, the body 210 and the protruding part 220 may be formed integrally. In some embodiments, the first fastener 200 may include the same material as the substrate 100. The protruding part 220 with elasticity may is advantageous to fasten the printed circuit board. In some embodiments, the body 210 may have a length L2 and a width W2, and the protruding part 220 may have a length L2 and a width W3, as illustrated in FIG. 3A. In some embodiment, the ratio of the width W1 of the primary recess 110 (shown in FIG. 1) to the length L2 of the first fastener 200 is about 1.5-5, such a 1.6, 1.7, 1.8, 1.9, 2.0, 2.5, 3, 3.5, 4, 4.5, 4.6, 4.7, 4.8, or 4.9. In some embodiments, the ratio of the width W2 of the body 210 to the width W3 of the protruding part 220 is about 1-3, such as 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, or 2.9.

Reference is made to FIG. 3B. FIG. 3B is a top view illustrating the second fastener 300 of the holder 1000 in accordance with various embodiments of the present disclosure. The second fastener 300 may be similar to the first fastener 200 depicted in FIG. 3A. In other words, the second fastener 300 may include a body 310 and a protruding part 320 projecting from a side of the body 310. In some embodiments, the protruding part 320 adjoins the third sidewall 115 of the primary recess 110, as shown in FIG. 1. In some embodiments, the protruding part 320 of the second fastener 300 includes elastic plastic. In some examples, the body 310 may include the same material as the protruding part 320. More specifically, the body 310 and the protruding part 320 may be formed integrally. In some embodiments, the second fastener 300 may include the same material as the substrate 100. The body 310 may have a length L3 and a width W4, and the protruding part 320 may have a length L3 and a width W5, as illustrated in FIG. 3B. In some embodiments, the dimension of the second fastener 300 may be equal to the corresponding part of first fastener 200. For example, the length L3, the widths W4, W5 of the second fastener 300 may be respectively equal to the length L2, the widths W2, W3 of the first fastener 200. In other embodiments, the dimension of the second fastener 300 may be different from the corresponding part of first fastener 200. In some embodiment, the ratio of the width L1 of the primary recess 110 shown in FIG. 1 to the length L3 of the second fastener 300 is about 1.5-5, such a 1.6, 1.7, 1.8, 1.9, 2.0, 2.5, 3, 3.5, 4, 4.5, 4.6, 4.7, 4.8, or 4.9. It is understood that the number, the dimension, the configuration, and the arrangement of the first fastener 200 and the second fastener 300 are not limited to FIG. 1.

It is understood that the material of the components that have been described above will not be repeated hereafter. In the following description, embodiments of a printed circuit board 500 placed in the holder 1000 and the operations of testing the printed circuit board 500 by utilizing the holder 1000 will be described.

Figure 4:
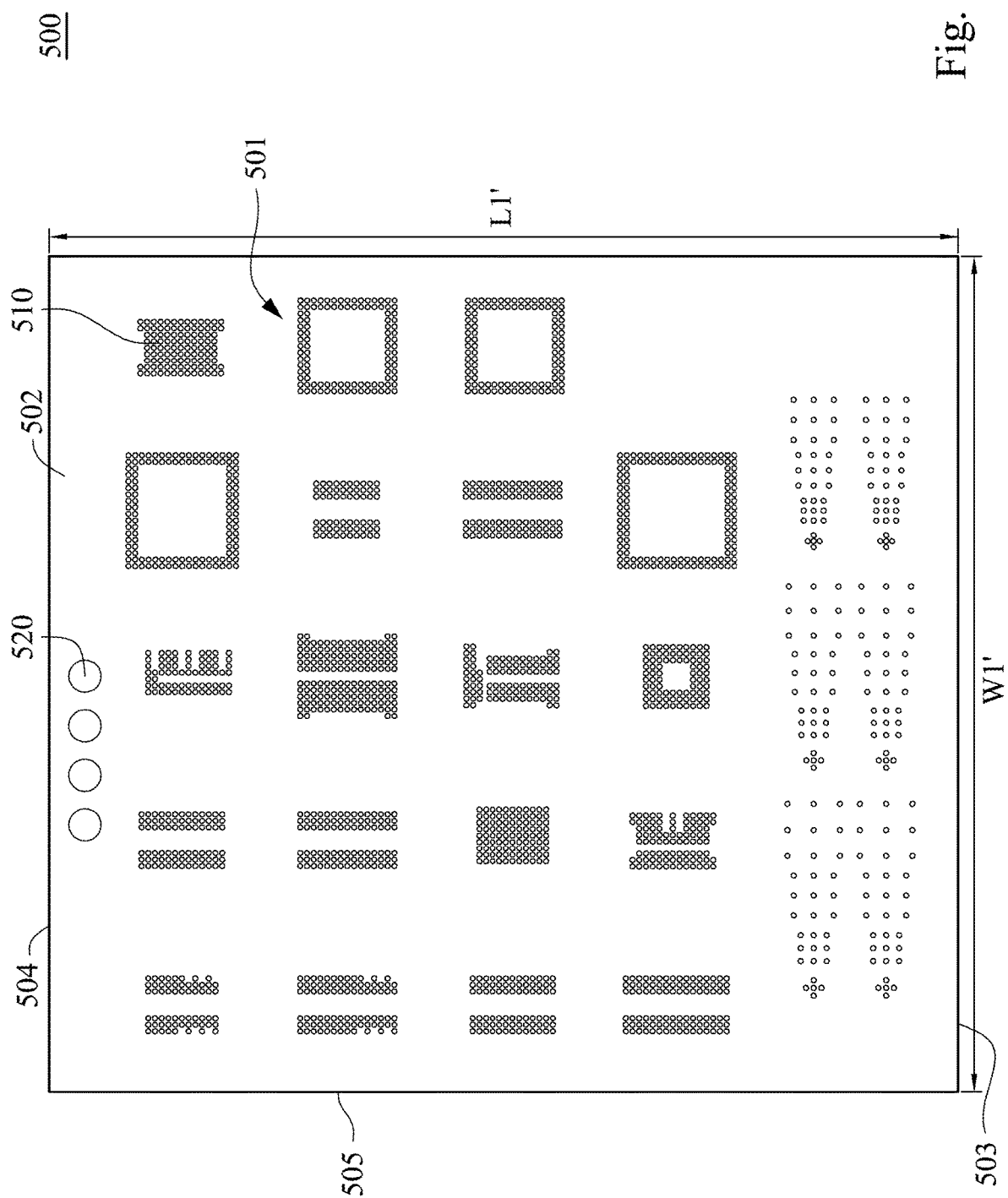
FIG. 4 is a top view illustrating a printed circuit board (PCB) in accordance with various embodiments of the present disclosure.

FIG. 4 is a top view illustrating a printed circuit board (PCB) 500 in accordance with various embodiments of the present disclosure. In various embodiments, the PCB 500 may be any kinds of PCB, such as a metal core PCB, a metal PCB (MPCB), a flexible PCB (FPCB), or the like. The PCB 500 may include a main body 502, at least one chip 510 and a plurality of connecting points 520. The main body 502 may have a top surface 501, a first side 503, and a second side 504 opposite thereto, and a third side 505 connected the first side 503 and the second side 504. The chip 510 and the connecting points 520 may protrude from the main body 502. The connecting points 520 may approach the second side 504. It is understood that the number, the dimension, and the arrangement of the chip 510 and connecting points 520 are not limited to FIG. 4, it can be changed depending on the need. The PCB 500 may have a length L1' and a width W1'. In some examples, the length L1' may be about 12 cm, and the width W1' may be about 10.5 cm.

Figure 5:
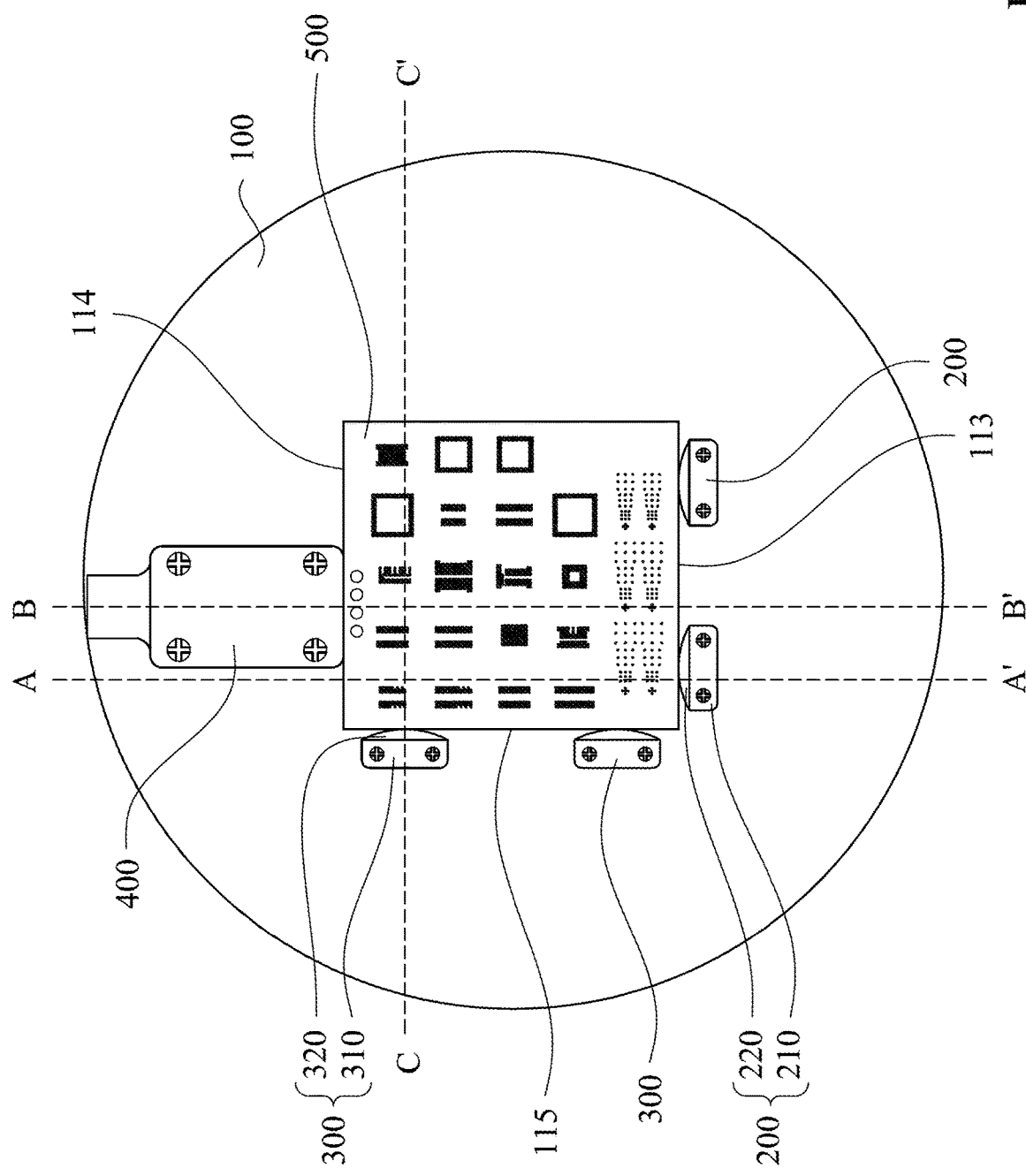
FIG. 5 is a top view illustrating a PCB placed in the holder in accordance with some embodiments of the present disclosure.

FIG. 5 is a top view illustrating the PCB 500 placed in the holder 1000 in accordance with some embodiments of the present disclosure. Reference is made to FIG. 5. The PCB 500 is placed on the holder 1000. More specifically, the PCB 500 is placed in the primary recess 110. The first fastener 200 and the pressure block 400 abut upon the PCB 500 and collectively fasten the PCB 500 in the primary recess 110.

FIG. 6A is a cross-sectional view illustrating the PCB 500 placed in the holder 1000 along a cross-section A-A' in FIG. 5 in accordance with various embodiments of the present disclosure. As shown in FIG. 5 and FIG. 6A, the first side 503 of the PCB 500 adjoins the first sidewall 113 of the primary recess 110 and contacts the first fastener 200. More specifically, the first side 503 of the PCB 500 contacts the protruding part 220 of the first fastener 200. The protruding part 220 with elasticity is advantageous to fix the PCB 500. The PCB 500 has a dimension that is substantially equal to the dimension of the primary recess 110. That is, the length L1 and the width W1 of the primary recess 110 shown in FIG. 1 are substantially equal to the length L1' and the width W1' of the PCB 500 shown in FIG. 5. In some embodiments, the PCB 500 has a thickness H3 that is substantially equal to the depth D1 (shown in FIG. 2A) of the primary recess 110, therefore the top surface 501 of the PCB 500 is substantially leveled with the top surface 102 of the substrate 100 and the top 202 of the first fastener 200. More specifically, the holder 1000 and the PCB 500 may have a substantially planar top surface, therefore it can prevent a probe of a testing device from damage during testing the PCB 500.

In some embodiments, the chip 510 may have a thickness H4 protruding from the main body 502, and may be positioned in the cavity 120. In some embodiments, the thickness H4 of the chip 510 may be substantially equal to the depth D2 (shown in FIG. 2A) of the cavity 120. In other embodiments, the thickness H4 of the chip 510 may be less than the depth D2 (shown in FIG. 2A) of the cavity 120. When testing the PCB 500, the highland portion 122 can support the PCB 500, such that the PCB 500 does not displace in the vertical direction which is perpendicular to the PCB 500. Therefore, it can prevent the probe of the testing device from damage due to the displacement of the PCB 500.

FIG. 6B is a cross-sectional view illustrating the PCB 500 placed in the holder 1000 along a cross-section B-B' in FIG. 5 in accordance with various embodiments of the present disclosure. Referring to FIG. 5 and FIG. 6B. The second side 504 of the PCB 500 adjoins the second sidewall 114 of the primary recess 110, and contacts the pressure block 400. At least one cable 530 may be positioned in the channel recess 150, and the cable is pressed by the pressure block 400 to be fix in the channel recess 150. The cable 530 may electrically connect with the connecting points 520 and the power terminal 410. The top surface 501 of the PCB 500 may be substantially leveled with the top 402 of the pressure block 400, and therefore can prevent the probe of the testing device from damage during testing.

Figure 6C:
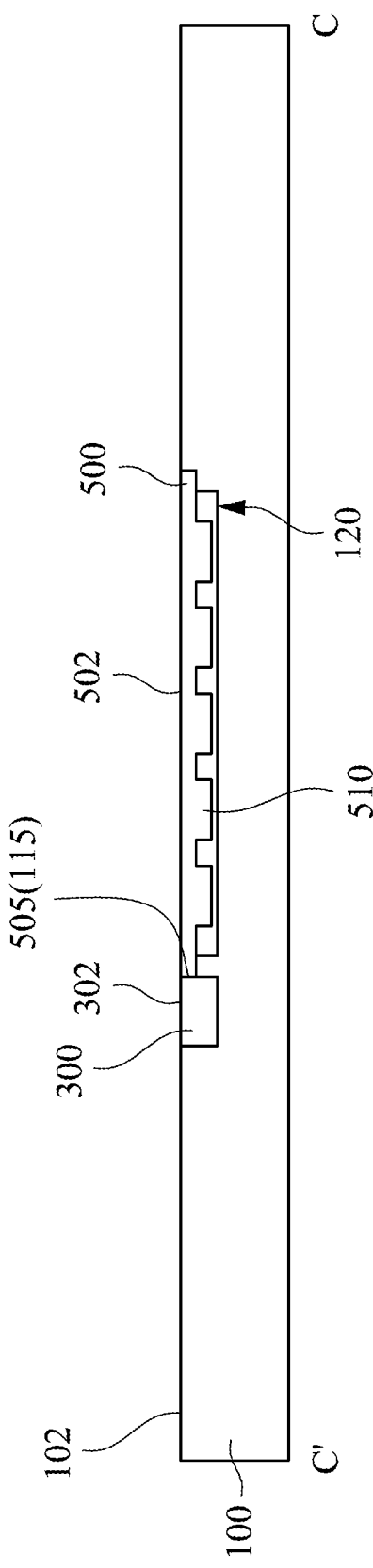

FIG. 6C is a cross-sectional view illustrating the PCB 500 placed in the holder 1000 along a cross-section C-C' in FIG. 5 in accordance with various embodiments of the present disclosure. Referring to FIG. 5 and FIG. 6C. The third side 505 of the PCB 500 adjoins the third sidewall 115 of the primary recess 110. In some embodiments, the second fastener 300 may contact the third side 505 of the PCB 500. In some examples, the protruding part 320 of the second fastener 300 props the third side 505 of the PCB 500. The second fastener 300 may advantage to fix the PCB 500. More specifically, the first fastener 200, the second fastener 300, and the pressure block 400 can collectively fix the PCB 500 in the primary recess 110. In some embodiments, the top 302 of the second fastener 300 may be substantially leveled with the top surface 501 of the PCB 500 and the top surface 102 of the substrate 100, and therefore can prevent the probe of the testing device from damage during testing.

To test the PCB 500, the holder 1000 with a PCB 500 thereon (as shown in FIG. 5) may be placed on a testing device. The testing device may have a probe to test the PCB 500. When testing electrical properties of the PCB 500, the testing device can rotate the holder 1000, such that the probe can contact any testing point on the PCB 500 easily without complicate adjusting process. Moreover, the top surface 501 of the PCB 500 is substantially leveled with the top surface of the holder 1000 (i.e., the top surface 102 of the substrate 100, the top 202 of the first fastener 200, the top 302 of the second fastener 300, and the top 402 of the pressure block 400), therefore the probe can move on the holder 1000 and PCB 500 without the concern of damage caused by hitting any component of the PCB 500 and the holder 1000 during the testing process.

From the above descriptions, the holder of this invention can accommodate a printed circuit board (PCB) to be tested. The PCB may be fastened steady in the primary recess of the holder by at least one first fastener and the pressure block. The holder having the PCB placed thereon is then placed on a testing device for testing. When testing electrical properties of the PCB, the testing device can rotate the holder, such that a probe of the testing device may easily contact testing points of the PCB without complicated adjusting process. Accordingly, the testing process is easy, the testing efficiency and the stability can be improved. Moreover, because of the top surface of the holder and the PCB are substantially leveled with each other, the probe can move on the PCB and holder during testing process without the concern of damage caused by hitting the components of the holder and the PCB. In addition, the holder includes PTFE, therefore, the shifting of the PCB result from the expansion of the holder under high temperature testing environment does not happen.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A holder, comprising:
   a substrate comprising:
      a top surface;
      a primary recess recessed from the top surface,
      at least one first side-recess recessed from the top surface, wherein the first side-recess neighbors and communicates with the primary recess; and
      a channel recess recessed from the top surface, wherein the channel recess communicates with the primary recess and extends from the primary recess to a power terminal on one end of the substrate, and the first side-recess and the channel recess are positioned at opposite sides of the primary recess;
   at least one first fastener disposed in the first side-recess, wherein the first fastener has a top substantially leveled with the top surface of the substrate; and
   a pressure block disposed in the channel recess, wherein the pressure block has a top substantially leveled with the top surface of the substrate.

2. The holder of claim 1, wherein the substrate further comprises at least one cavity which is recessed from a bottom of the primary recess.

3. The holder of claim 1, wherein the primary recess has a depth of about 0.5 mm to 3 mm from a bottom of the primary recess.

4. The holder of claim 1, wherein the primary recess has a polygon contour in a plan view.

5. The holder of claim 1, wherein the primary recess has a first sidewall, a second sidewall opposite thereto, and third sidewall connected the first sidewall and the second sidewall, wherein the first side-recess adjoins the first sidewall and the channel recess adjoins the second sidewall.

6. The holder of claim 5, wherein the substrate further comprises at least one second side-recess recessed from the top surface, and the second side-recess neighboring and communicated with the third sidewall of the primary recess.

7. The holder of claim 6, further comprising at least one second fastener disposed in the second side-recess, wherein the second fastener has a top substantially leveled with the top surface of the substrate.

8. The holder of claim 1, wherein the substrate comprises polytetrafluoroethylene.

9. The holder of claim 1, wherein the substrate, the first fastener, and the pressure block comprise same material.

10. The holder of claim 1, wherein the first fastener further comprises:
    a body; and
    a protruding part projecting from a side of the body, wherein the protruding part adjoins the primary recess.

11. The holder of claim 10, wherein the protruding part of the first fastener comprises elastic plastic.

12. The holder of claim 1, wherein the primary recess spaces the pressure block apart from the first fastener.

13. The holder of claim 1, wherein an orthogonal projection of the primary recess on the substrate does not overlap with an orthogonal projection of the first fastener on the substrate and an orthogonal projection of the pressure block on the substrate.

* * * * *